US006836232B2

(12) United States Patent
Bu

(10) Patent No.: US 6,836,232 B2
(45) Date of Patent: Dec. 28, 2004

(54) APPARATUS AND METHOD FOR GAMMA CORRECTION IN A LIQUID CRYSTAL DISPLAY

(75) Inventor: Lin-Kai Bu, Tainan (TW)

(73) Assignee: Himax Technologies, Inc., Tainan (TW)

( * ) Notice: Subject to any disclaimer, the term of this patent is extended or adjusted under 35 U.S.C. 154(b) by 0 days.

(21) Appl. No.: 10/335,519

(22) Filed: Dec. 31, 2002

(65) Prior Publication Data

US 2003/0122757 A1 Jul. 3, 2003

Related U.S. Application Data

(63) Continuation-in-part of application No. 10/064,207, filed on Jun. 21, 2002.

(30) Foreign Application Priority Data

Dec. 31, 2001 (TW) ........................................ 90133345 A

(51) Int. Cl.[7] ................................................ H03M 1/66
(52) U.S. Cl. ....................................... 341/144; 341/118
(58) Field of Search ................................ 341/144, 118, 341/138, 155; 345/87, 98, 83; 348/572

(56) References Cited

U.S. PATENT DOCUMENTS 5,532,827 A * 7/1996 Kajitani et al. .............. 358/3.1
5,940,058 A * 8/1999 Koyama ...................... 345/89
6,268,841 B1 * 7/2001 Cairns et al. ................. 345/98
6,437,716 B2 * 8/2002 Nakao ........................ 341/118
6,445,323 B1 * 9/2002 Cairns et al. ............... 341/144
6,535,152 B2 * 3/2003 Lee ............................ 341/118
6,593,934 B1 * 7/2003 Liaw et al. ................. 345/590

OTHER PUBLICATIONS

Chang et al., Embedded and Programmable Gamma Correction Circuit, US 2003/0142084.*

Naito, Display Device Gamma Correction Method and Electronic Equipment, US 2002/0126106.*

Sasaki, Image Processing Apparatus and Image Processing System, US 2002/0186223.*

* cited by examiner

*Primary Examiner*—Peguy JeanPierre
(74) *Attorney, Agent, or Firm*—Thomas, Kayden, Horstemeyer & Risley

(57) ABSTRACT

A gamma correction apparatus for a liquid crystal display comprises a reference voltage generating circuit and a gamma correction circuit. The reference voltage generating circuit outputs a plurality of reference voltages according to the pixel data. The gamma correction circuit gamma-corrects the pixel data according to the reference voltages. The feature of the invention resides in that the reference voltage generating circuit outputs the corresponding reference voltages to gamma-correct the pixel data according to the positions of the pixels corresponding to the pixel data in the LCD monitor and the display colors of the pixels.

24 Claims, 7 Drawing Sheets

| | | Reference pixel data pdr | | | | | | | | Delta reference pixel data dpdr | | | | | | | |
|---|---|---|---|---|---|---|---|---|---|---|---|---|---|---|---|---|---|
| Monitor block | | 1 | 2 | 3 | 4 | 5 | 6 | 7 | 8 | 1 | 2 | 3 | 4 | 5 | 6 | 7 | 8 |
| N | R | 63 | 50 | 37 | 30 | 26 | 19 | 10 | 0 | 13 | 13 | 7 | 4 | 7 | 9 | 10 | |
| | G | 62 | 49 | 36 | 29 | 25 | 19 | 10 | 0 | -1 | -1 | -1 | -1 | -1 | 0 | 0 | 0 |
| | B | 60 | 47 | 35 | 28 | 24 | 18 | 9 | 0 | -2 | -2 | -1 | -1 | -1 | -1 | -1 | 0 |
| N+1 | R | 62 | 49 | 36 | 30 | 26 | 19 | 10 | 0 | -1 | -1 | -1 | 0 | 0 | 0 | 0 | 0 |
| | G | 62 | 49 | 36 | 30 | 26 | 20 | 10 | 0 | 0 | 0 | 0 | 1 | 1 | 1 | 0 | 0 |
| | B | 61 | 48 | 36 | 28 | 24 | 18 | 8 | 0 | 1 | 1 | 1 | 0 | 0 | 0 | -1 | 0 |
| N+2 | R | 61 | 48 | 36 | 30 | 26 | 19 | 11 | 1 | -1 | -1 | 0 | 0 | 0 | 0 | 1 | 1 |
| | G | 62 | 49 | 36 | 31 | 27 | 21 | 10 | 0 | 0 | 0 | 0 | 1 | 1 | 1 | 0 | 0 |
| | B | 60 | 47 | 35 | 28 | 24 | 18 | 8 | 0 | -1 | -1 | -1 | 0 | 0 | 0 | 0 | 0 |

FIG. 9

APPARATUS AND METHOD FOR GAMMA CORRECTION IN A LIQUID CRYSTAL DISPLAY

This application is a continuation in part of Ser. No. 10/064,207 filed on Jun. 21, 2002.

This application claims the benefit of Taiwan application Serial No. 090133345, filed Dec. 31, 2001.

BACKGROUND OF THE INVENTION

1. Field of the Invention

The invention relates in general to an apparatus and a method for converting a digital signal into a corresponding analog signal, and more particularly to an apparatus and a method used in a liquid crystal display for executing gamma correction.

2. Description of the Related Art

Recently, liquid crystal displays (LCDs) have been widely used because they have favorable advantages of thinness, lightness, and low electromagnetic radiation.

The LCD monitor has a plurality of pixels arranged in an array. Each pixel is composed of an upper plate, a lower plate, and a liquid crystal layer between the upper plate and the lower plate. Liquid crystal molecules are filled between the upper plate and the lower plate to form the liquid crystal layer. The upper plate and the lower plate have electrodes. When voltages are applied to the electrodes of the upper plate and the lower plate to generate a voltage difference between the upper plate and the lower plate, the orientations of the liquid crystal molecules in the liquid crystal layer may vary with the change of the voltage difference. The orientations of the liquid crystal molecules may affect the ratio of light transmitting through the pixel, which is called light transmissivity. The magnitude of the light transmissivity determines the brightness of the pixel. As the light transmissivity increases, the pixel becomes brighter. Therefore, by controlling the voltage difference between the upper plate and the lower plate, different pixels on the LCD monitor may have different brightness.

Please refer to FIG. 1, which shows the gamma relation between the light transmissivity and the voltage difference between the upper plate and lower plate of the pixel. The relation between the light transmissivity and the voltage difference between the upper plate and lower plate is non-linear, as shown by the gamma curve of FIG. 1. The voltage difference between the upper plate and lower plate is called the gamma voltage. In addition, the light transmissivity only relates to the magnitude of the gamma voltage, but has nothing to do with the polarity of the gamma voltage. Hence, the gamma curve is composed of a positive-polarity gamma curve 102 and a negative-polarity gamma curve 104, both of which are symmetrical with respect to the longitudinal coordinate. If two gamma voltages with the same magnitude but different polarities are applied to a pixel, the pixel may have the same light transmissivity under the two conditions. If the gamma voltage with fixed polarity is applied to each pixel continuously, the liquid crystal molecules of the pixel may be damaged. Therefore, it is possible to protect the liquid crystal molecules by alternating the polarities of the gamma voltages applied to the pixels.

In general, the pixel data input to the LCD is binary digital data. Since the relation between the gamma voltage and the light transmissivity of the pixel is non-linear, the LCD needs a particular circuit device for converting the digital pixel data into corresponding driving voltage to the upper plate or the lower plate according to the gamma curve so that the relations between the values of the pixel data and the light transmissivity of the pixel are linear. The above-mentioned operation is called the gamma correction, which may enhance the display quality of the LCD monitor.

Please refer to FIG. 2, which is a schematic illustration showing the gamma correction principle. When the gamma correction is performed, multiple sets of pixel data are selected as reference pixel data. In FIG. 2, the pixel data D0, D1, D2, D3 and D4 serve as the reference pixel data. According to the gamma curve, each reference pixel data corresponds to a positive-polarity reference voltage and a negative-polarity reference voltage, respectively. Taking the reference pixel data D0 as an example, it corresponds to a positive-polarity reference voltage V0 and a negative-polarity reference voltage V9. Similarly, the five sets of reference pixel data D0 to D4 correspond to the five positive-polarity reference voltages V0 to V4 and the five negative-polarity reference voltages V9 to V5, respectively, as shown in FIG. 2. The general pixel data mentioned above, is 8-bit binary data and may be represented as 256 gray-scale values. During gamma correction, the corresponding relation between the reference pixel data and the reference voltage may be used as the basis to derive driving voltage corresponding to all other pixel data by way of an interpolation method. Each pixel data may correspond to a positive-polarity driving voltage and a negative-polarity driving voltage.

It should be noted that the driving voltage corresponding to each pixel data becomes more precise as the number of selected reference pixel data for gamma correction increases. In general, eight sets of reference pixel data are selected to perform gamma correction. According to the gamma curve, eight sets of reference pixel data correspond to eight positive-polarity reference voltages and eight negative-polarity reference voltages, respectively. The gamma correction apparatus may perform the gamma correction on the basis of these sixteen reference voltages.

Please refer to FIG. 3, which is a schematic illustration showing the conventional gamma correction apparatus 300. The gamma correction apparatus 300 includes a gamma correction circuit 302 and a reference voltage generating circuit 304 coupled to the gamma correction circuit 302. The reference voltage generating circuit 304 has a resistor string composed of 17 resistors r1 to r17 connected in series. The first and final nodes of the resistor string are coupled to the voltage source 304. Each node of the resistor string may output reference voltages Vr, including eight positive-polarity reference voltages Vr(+) and eight negative-polarity reference voltages Vr(−) by properly controlling the resistance values of the resistors. Each reference voltage Vr is output to the gamma correction circuit 302 through the buffer BUF. The gamma correction circuit 302 outputs corresponding driving voltage $V_{GM}$ by gamma-correcting each pixel data using an interpolation method based on the reference voltages Vr.

The conventional reference voltage generating circuit 304 outputs a set of reference voltages Vr for the gamma correction circuit 302 to perform gamma correction using resistors to divide the voltage. For a color LCD, pixels on the monitor represent red (R), green (G), and blue (B), respectively. The pixels representing different colors may not have the same gamma curves. In addition, for a large-scale LCD monitor, since the degree of manufacturing difficulty increases, the gap distance between the upper plate and lower plate in the entire LCD monitor are difficult to keep the same. The gap differences between the upper plate and the lower plate may adversely influence the gamma curves for the pixels. Therefore, the gamma curves of all pixels are not completely the same on a large-scale LCD monitor.

In sum, the gamma curves of the pixels on the LCD monitor may be different from one another because the pixel colors and the gap distances between the upper plate and lower plate are not completely the same. If only one fixed reference voltage is output according to only one fixed gamma curve to gamma-correct all pixel data, the whole LCD monitor may represent undesirable frame colors, which are not identical to the ideal frame colors. Such an occurrence of color shading may cause the LCD to have display quality that is not optimum.

SUMMARY OF THE INVENTION

It is therefore an object of the invention to provide an apparatus and method for gamma correction, in which the effect of the gamma correction is free from influence by the pixel colors and gap differences between the upper plate and the lower plate, so as to solve the color shading problem and enhance the display quality for the LCD monitor.

The invention achieves the above-identified object by providing an apparatus for gamma correction in a liquid crystal display (LCD) for gamma-correcting pixel data and outputting a corresponding driving voltage to an LCD monitor according to the pixel data, wherein the pixel data is used to determine the brightness of a pixel in the LCD monitor. The gamma correction apparatus comprises a reference voltage generating circuit and a gamma correction circuit. The reference voltage generating circuit outputs a plurality of reference voltages according to the pixel data. The gamma correction circuit gamma-corrects the pixel data according to the reference voltages. The feature of the invention resides in that the reference voltage generating circuit outputs the corresponding reference voltages to gamma-correct the pixel data according to the positions of the pixels corresponding to the pixel data in the LCD monitor and the display colors of the pixels.

Other objects, features, and advantages of the invention will become apparent from the following detailed description of the preferred but non-limiting embodiments. The following description is made with reference to the accompanying drawings.

BRIEF DESCRIPTION OF THE DRAWINGS

FIG. 9 is a schematic illustration showing an example of the delta coding principle.

DETAILED DESCRIPTION OF THE INVENTION

The feature of the invention resides in that the whole LCD monitor is divided into a plurality of monitor blocks. The gamma correction is performed according to the pixel color corresponding to each pixel data and the monitor block to which the pixel belongs.

The concept of the invention is to divide the whole LCD monitor into a number of monitor blocks and to perform gamma correction on each one. In this embodiment, for illustration purposes, the resolution for the color LCD monitor is selected to be 1024×768 (the LCD monitor has 768 pixel rows each having 1024 display units, and each display unit has 3 pixels displaying red, green and blue, respectively), and the whole LCD monitor is divided into 192 (16×12) monitor blocks. Because the gap differences between the upper plate and lower plate of the pixels in each monitor block are relatively small, the differences between the gamma curves of pixels in the same monitor block are relatively small. Consequently, if each monitor block is regarded as a unit for gamma correction, color shading of the LCD monitor resulting from gap differences between the upper plate and lower plate of the pixels can be avoided.

In addition, when the gamma correction for the pixel data is performed, the monitor block to which the pixel corresponding to the pixel data belongs has to be considered, and the driving voltage corresponding to the pixel also has to be determined according to the display color of the pixel. That is, the gamma correction for the pixels of each monitor block may be performed according to the display colors of the pixels. In other words, the concept of the invention is to gamma-correct the pixel data of the pixels, which displays different colors and is input to different monitor blocks. Thus, the color-shading problem of the LCD monitor resulting from different colors displayed at the pixel may be solved.

Figure 1:
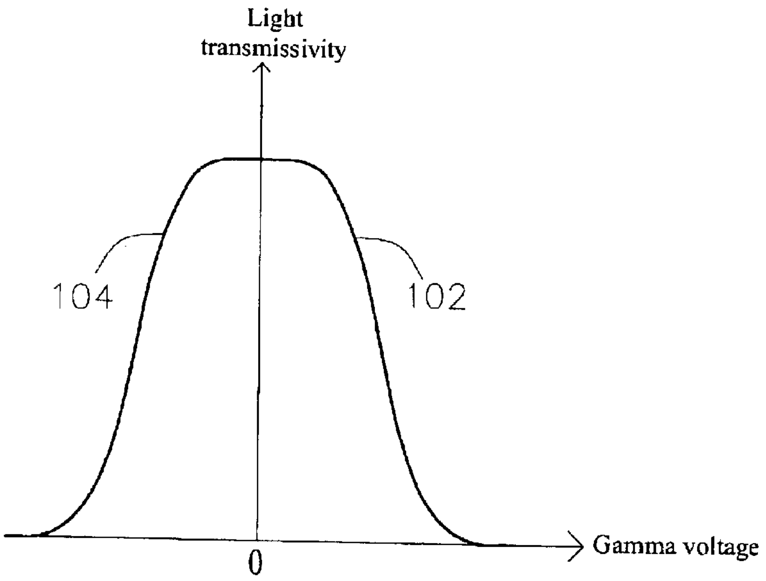
FIG. 1 (PRIOR ART)
FIG. 1 is a graph showing the gamma relation between the light transmissivity and the voltage difference between the upper plate and lower plate of the pixel.
Figure 2:
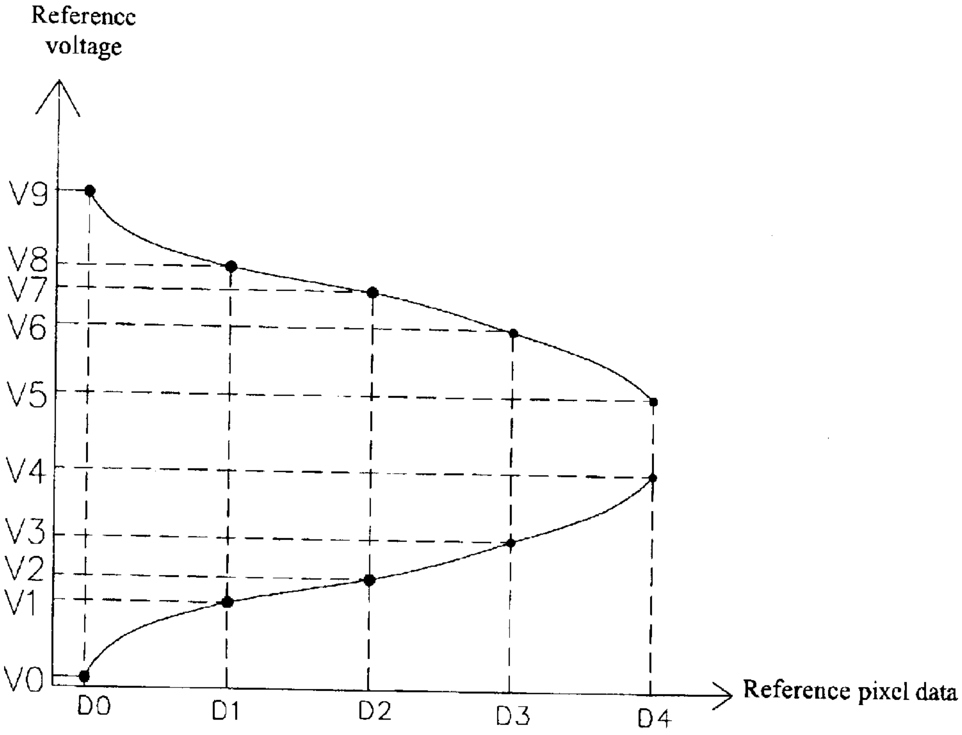
FIG. 2 (PRIOR ART)
FIG. 2 is a schematic illustration showing the gamma correction principle.
Figure 3:
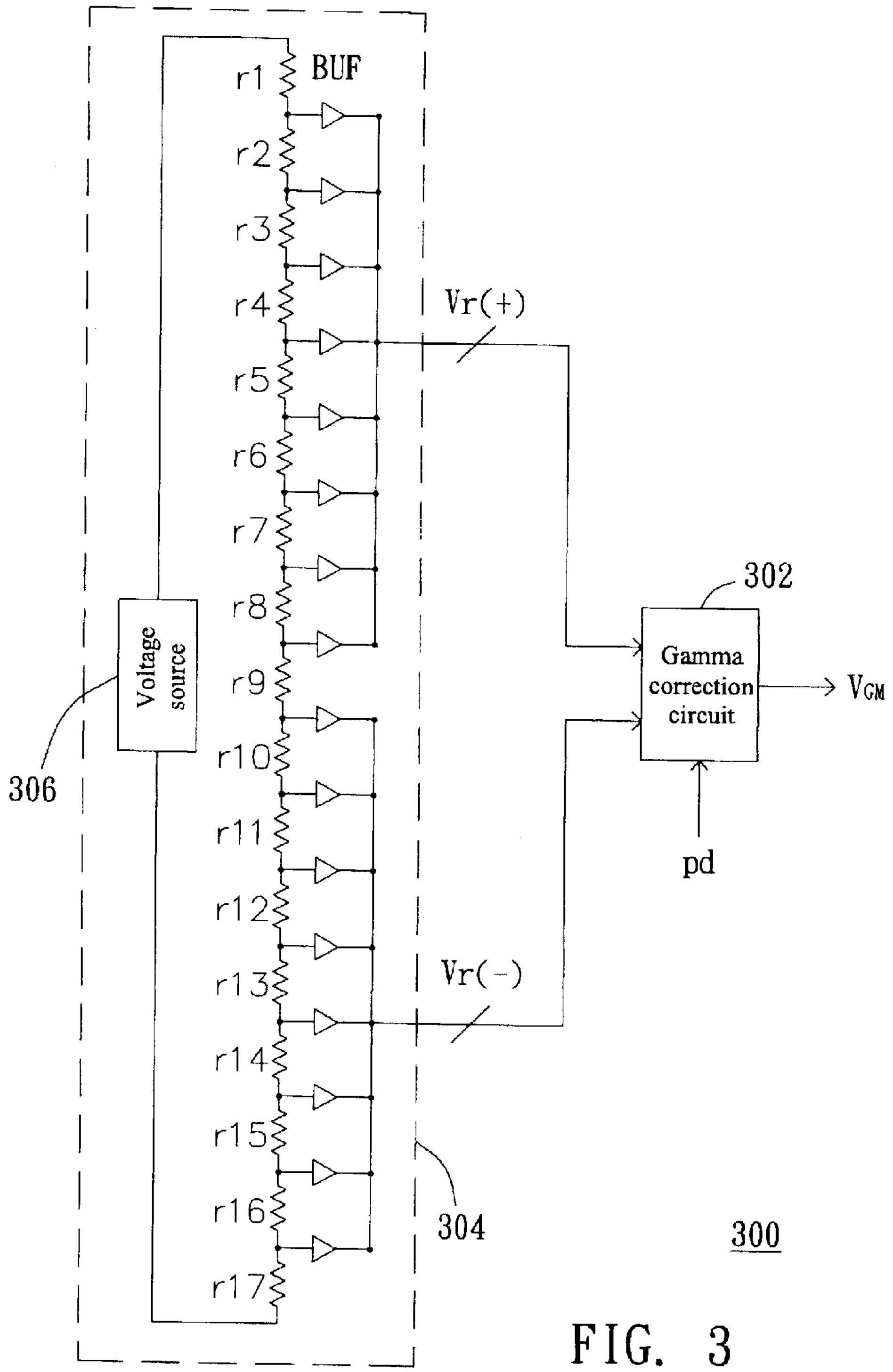
FIG. 3 (PRIOR ART)
FIG. 3 is a circuit block diagram showing a conventional gamma correction apparatus.
Figure 4:
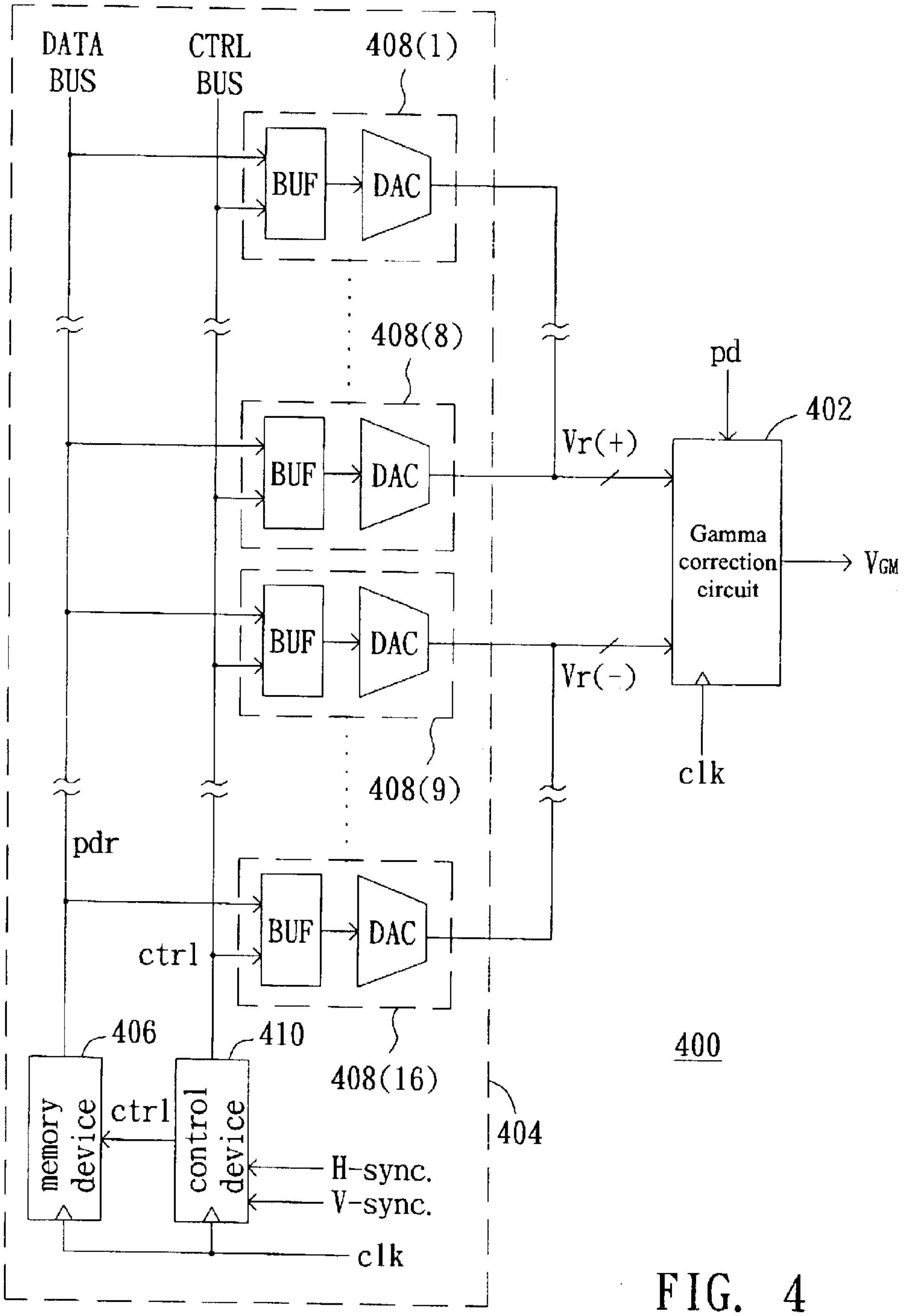
FIG. 4 is a circuit block diagram showing a gamma correction apparatus according to one embodiment of the invention.

Please refer to FIG. 4, which is a circuit block diagram showing the gamma correction apparatus 400 proposed by the invention. The gamma correction apparatus 400 includes a gamma correction circuit 402 and a reference voltage generating circuit 404 coupled to the gamma correction circuit 402. The reference voltage generating circuit 404 is composed of a memory device 406, multiple reference voltage output circuits 408 and a control device 410. The conventional reference voltage generating circuit generates the reference voltage Vr for gamma correction by using resistors of the resistor string to divide the voltage. However, the invention pre-defines various reference pixel data sets according the gamma curve relations for pixels displaying different colors in different monitor blocks. Each reference pixel data set has a number of reference pixel data pdr. In this embodiment, a reference pixel data set has sixteen reference pixel data pdr. All reference pixel data pdr with the digital formats are stored in the memory device 406 in the form of a look-up-table, and the whole LCD monitor is divided into 192 monitor blocks. Each monitor block requires three sets of reference pixel data to gamma-correct the pixel data pd according to the display color of the pixel. Therefore, the memory device 406 of the reference voltage generating circuit 404 requires 576 (=16×12×3) sets of reference pixel data. The control device 410 obtains the information about the display color of the pixel and the monitor block to which the pixel to be controlled by the pixel data pd belongs according to the clock signal clk and the horizontal sync signal H-sync. The control device 410 outputs the control signal ctrl to the memory device 406 and to the reference voltage output circuits 408 according to the clock signal clk and the horizontal sync signal H-sync, respectively. The memory device 406 outputs the reference pixel data pdr for correcting the reference pixel data set of the pixel data pd to the corresponding reference voltage output circuits 408 according to the control signal ctrl. The reference voltage output circuits 408 receive corresponding reference pixel data pdr according to the control signal ctrl output from the control device 410. Each reference voltage output circuit 408 also includes a buffer device BUF and a digital-to-analog converter (DAC) for outputting a corresponding reference voltage Vr to the gamma correction circuit 402 according to the reference pixel data pdr. Taking FIG. 4 as an example, the reference voltage generating circuit 404 includes sixteen reference voltage output circuits 408(1) to 408(16) for outputting the reference voltages Vr, respectively. Eight reference voltage generating circuits 408 (1) to 408 (8) output the positive-polarity reference voltage Vr(+), while the other eight reference voltage generating circuits 408(9) to 408(16) output the negative-polarity reference voltage Vr(−). The gamma correction circuit 402 outputs a corresponding driving voltage $V_{GM}$ using the interpolation method on the basis of these reference voltages Vr according to each input pixel data pd. In sum, the most distinct feature of the invention is that the reference voltage generating circuit 404 can output a set of reference voltages Vr for executing gamma correction according to the monitor block to which the pixel controlled by the pixel data pd belongs and the display color of the pixel. This design may eliminate a drawback of the conventional gamma correction apparatus, in which the gamma correction may be performed using only one set of reference voltages. Furthermore, the color shading problem of the LCD monitor caused by different display colors of the pixel and different gaps between the upper plate and lower plate of the pixels may be resolved.

As mentioned above, the invention performs gamma correction using various sets of reference voltages Vr by dividing the whole LCD monitor into a matrix of monitor blocks. Thus, the apparent edges may occur at connections between each monitor block and other adjacent monitor blocks, and the display quality of the LCD monitor may be adversely influenced. When the gamma correction apparatus and method of the invention is employed to perform gamma correction, the edge portions of each monitor block have to be specially processed so that the connections between all the monitor blocks may be blurred. For the sake of description, the above-mentioned operation is called the blurring process. It should be noted that the pixel data pd is input to the gamma correction apparatus on the basis of the position of the corresponding pixel on the LCD monitor in a sequence from left to right and from top to bottom. Therefore, the method for blurring the vertical edge between the horizontal monitor blocks and the horizontal edge between the vertical monitor blocks is different.

Figure 5:
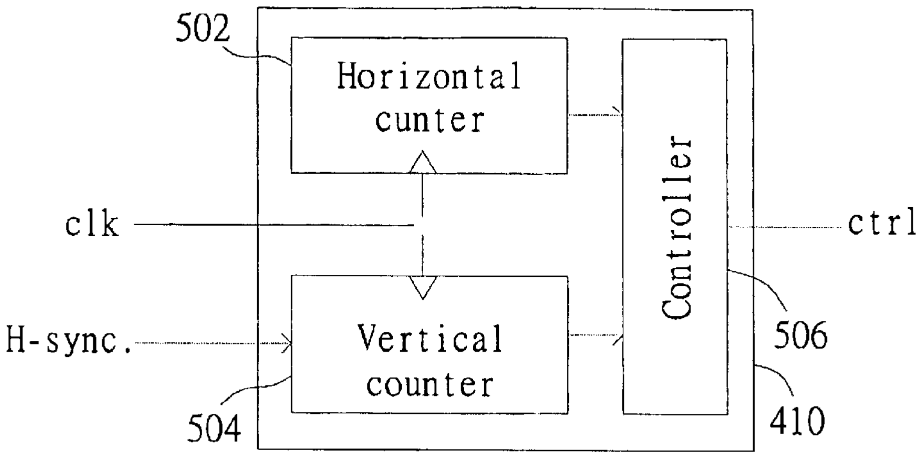
FIG. 5 is a circuit block diagram illustrating the control device shown in FIG. 4.

Please refer to FIG. 5, which shows a circuit block diagram of the control device shown in FIG. 4. The control device 410 includes a horizontal counter (H-counter) 502, a vertical counter (V-counter) 504, and a controller 506 coupled to counters 502 and 504, respectively. When gamma correction is performed, the pixel data pd is sequentially input to the gamma correction circuit according to the clock signal clk. The clock signal elk is simultaneously input to the horizontal counter 502 and the vertical counter 504, while the horizontal sync signal H-sync is input to the vertical counter 504. The horizontal counter 502 outputs the horizontal counting signal to the controller 506 according to the clock signal elk. The vertical counter 504 outputs the vertical counting signal to the controller 506 according to the clock signal elk and the horizontal sync signal H-sync, respectively. The controller 506 outputs the control signal ctrl to the memory device and the reference voltage output circuit according to the horizontal counting signal and the vertical counting signal. Accordingly, the memory device may be controlled to output the corresponding reference pixel data set, and the reference voltage output circuit may be controlled to output the reference voltage Vr according to the corresponding reference pixel data pdr.

Figure 6A:
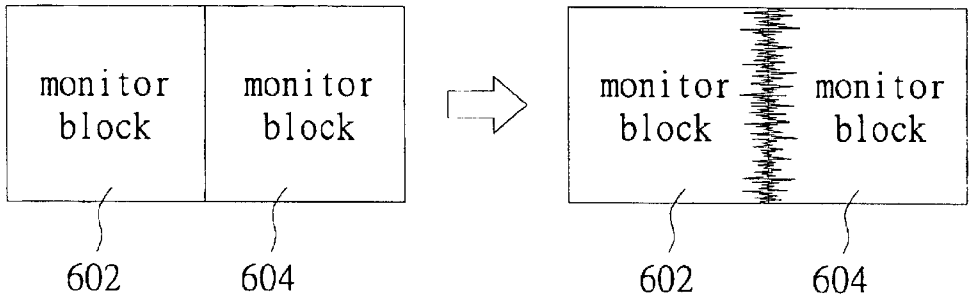
FIGS. 6A to 6B are schematic illustrations showing the blurred result after blurring an edge between two adjacent monitor blocks of the invention.
Figure 6B:
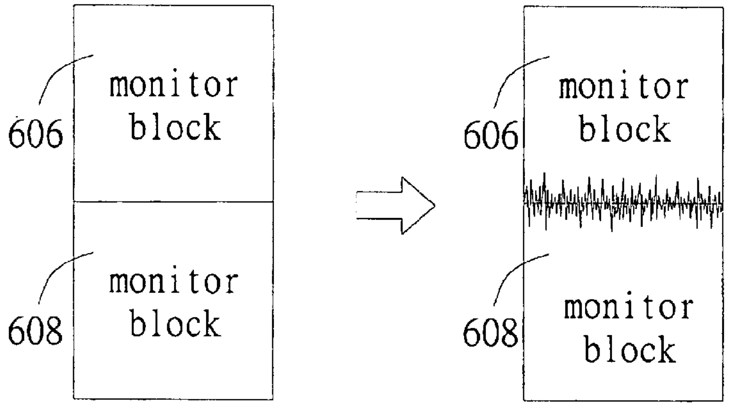

Please refer to FIGS. 6A to 6B, which are schematic illustrations showing the blurred result after blurring an edge between two adjacent monitor blocks of the invention. The principles and operations for blurring the vertical edge between the left and right monitor blocks and the horizontal edge between the up and down monitor blocks will be described with reference to the left and right monitor blocks 602 and 604 and the monitor blocks 606 and 608, respectively.

Please refer to FIGS. 5 and 6A simultaneously. The color LCD monitor with a resolution of 1024×768 in this embodiment is divided into 192 (=16×12) monitor blocks. Thus, the resolution of each monitor block is 64×64. In other words, theoretically, when the pixel data pd of any row of pixels belonging to the monitor block 602 is gamma-corrected, the controller 506 outputs the control signals ctrl to the memory device causing the memory device to output the reference pixel data set used in the next (or right) monitor block 604 after the controller 506 receives 64 theoretical clock signals clk. In this description, the cycle number of clock signals clk received during the duration needed for controller 506 to output two control signals ctrl to the memory device is defined as the clock counting number. During the blurring process, the clock counting number of the controller 506 approaches 64 but does not necessarily have to be exactly 64. In this embodiment, the clock counting number ranges from 61 to 67. In other words, when the pixel data pd of a row of pixels belonging to the monitor block 602 is gamma-corrected, the number of clock signals clk pulses received each time by the controller 506 is not limited to 64 but may be any number ranging from 61 to 67, for example 62. When the controller 506 receives 62 pulses of clock signals clk, the controller 506 may output the control signal ctrl to the memory device thus causing the memory device to output the reference pixel data set used in the next monitor block 604. Then, when the pixel data pd of the next row of pixels belonging to the monitor block 602 is gamma-corrected, a number, such as 67, may be selected from the given range of 61 to 67 pulses of clock signals clk. When the controller 506 receives 67 clock signals clk, it may output the control signal ctrl to the memory device, triggering the memory device to output the reference pixel data set used in the next monitor block 604. Analogically, it should be noted that the clock counting number for the controller 506 used for each row of pixels in each monitor block is predefined or determined by random selection. Thus, the boundary between the monitor blocks 602 and 604 is not a vertically straight line but is a saw-toothed line, as shown in FIG. 6A, so that the edge between the left and right monitor blocks may be blurred.

Please refer to FIGS. 5 and 6B simultaneously. In this embodiment, the resolution of each monitor block is 64×64. In other words, when the pixel data pd belonging to the monitor block 602 is gamma-corrected, the gamma correction for the pixel data pd of the 64 rows of pixels belonging to the monitor block 606 is theoretically finished when the horizontal counter 502 counts to 64. In this description, the number of counts necessary for the horizontal counter 502 to complete the gamma correction for the pixel data pd belonging to any monitor block is defined as the horizontal counting number. During the blurring process, the horizontal counting number of the horizontal counter 502 approaches 64 but is not always 64. The horizontal counting number actually ranges from 61 to 67. When the horizontal counter 502 counts to 61 (i.e., when the gamma correction apparatus gamma-corrects the pixel data pd of each pixel of the 61st row belonging to monitor block 606), the controller 506 may selectively control the memory device to continue to output the reference pixel data set gpdr used in the monitor block 606 or output the reference pixel data set gpdr' used in the monitor block 608 adjacent to the bottom edge of the monitor block 606. At this time, the possibility of selectively outputting the reference pixel data set gpdr used in the monitor block 606 is much greater than that of selectively outputting the reference pixel data set gpdr' used in the monitor block 608 adjacent to the bottom edge of the monitor block 606. However, as the horizontal counting number gets larger (i.e., when the pixel data pd of each pixel of the 62nd or 63rd row belonging to the monitor block 606 is gamma-corrected), the possibility of selectively outputting the reference pixel data set gpdr may approach that of selectively outputting the reference pixel data set gpdr'. When the pixel data pd of the pixels in the 64th row belonging to monitor block 606 is gamma-corrected, the possibility of outputting the reference pixel data set gpdr is equal to that of outputting the reference pixel data set gpdr'. When the pixel data pd of each pixel of the 65th row belonging to monitor block 606 is gamma-corrected (i.e., when the pixel data pd of each pixel of the first row theoretically belonging to the monitor block 608 is gamma-corrected), the possibility of selectively outputting the reference pixel data set gpdr' used in monitor block 608 starts to be greater than that of selectively outputting the reference pixel data set gpdr used in monitor block 606. When the horizontal count value is equal to 66 or 67 (i.e., when the pixel data pd of each pixel of the 66th or 67th rows belonging to monitor block 606 or the second and third rows belonging to the monitor block 608 is gamma-corrected), the possibility of selectively outputting the reference pixel data pdr' used in monitor block 608 increases, and the possibility of selectively outputting the reference pixel data pdr used in monitor block 606 decreases. The reference pixel data set gpdr' used in monitor block 608 is not totally output until the pixel data pd of each pixel of the fourth row in monitor block 608 is gamma-corrected. It should also be noted that when the pixel data pd corresponding to each row of pixels is gamma corrected, the gamma correction apparatus predefines and selects the reference pixel data set gpdr or gpdr', or selects it randomly. No matter which method is adopted, the obtained results must be able to meet the distribution possibilities of selecting the reference pixel data set gpdr or gpdr' as mentioned above. Therefore, the boundary between monitor blocks 606 and 608 is not a horizontally straight line, but is a saw-toothed line, as shown in FIG. 6B, so that the edge between the vertical monitor blocks may be blurred.

Figure 7:
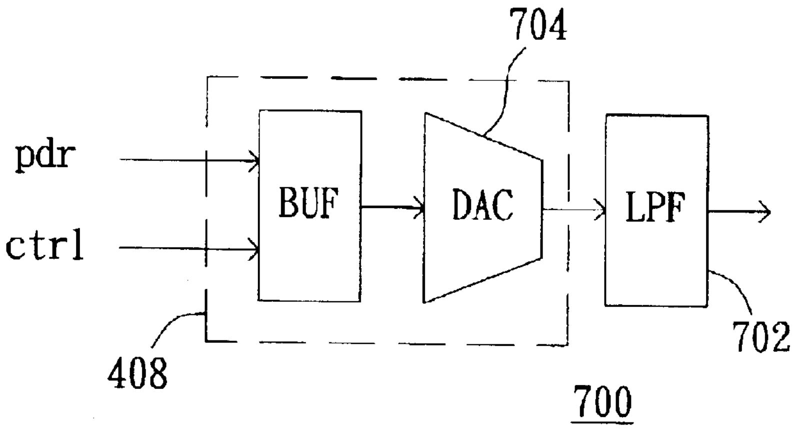
FIG. 7 is a circuit block diagram showing a reference voltage output circuit that may perform the blurring process.
Figure 8:
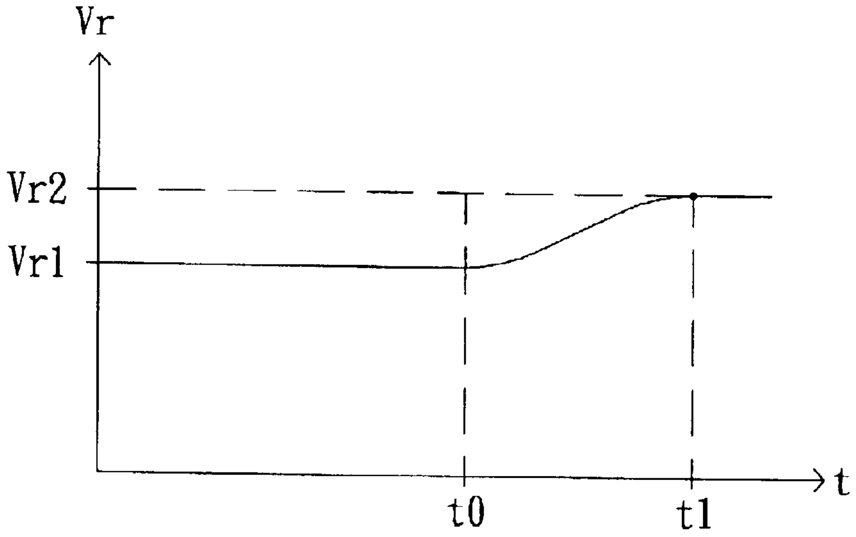
FIG. 8 is a schematic illustration showing the effect of the low-pass filter of FIG. 7.

In addition to the above-mentioned method, the invention further proposes another method for blurring the edge between the left and right monitor blocks. Please refer to FIG. 7, which is a circuit block diagram showing a reference voltage output circuit that may perform the blurring process. Compared to FIG. 4, the reference voltage output circuit 760 of FIG. 7 further includes a low-pass filter (LPF) 702 coupled to the DAC 704. When the magnitude of reference voltage output from the DAC 704 varies, the LPF 702 may ease the degree of variation. Please refer to FIG. 8, which is a schematic illustration showing the effect of the LPF in FIG. 7, in conjunction with FIG. 6A. At time t0, the gamma correction for the pixel data pd belonging to monitor block 602 is finished, and the memory device may output another reference pixel data set to gamma-correct the pixel data pd belonging to monitor block 604. If the reference voltage output circuit 700 receives different reference pixel data pdr, the DAC 704 may output a reference voltage Vr, which may vary correspondingly. It is assumed that the former output reference voltage is Vr1 and the reference voltage, which should be output corresponding to the reference pixel data pdr after time t0, is Vr2. If a LPF is not coupled to the DAC, the magnitude of the output reference voltage Vr of the reference voltage output circuit changes from Vr1 to Vr2 immediately after time t0. However, because the LPF 702 is coupled to the DAC 704, as shown in FIG. 7, the magnitude of the output reference voltage of the reference voltage output circuit 700 may slowly change from Vr1 and will not reach Vr2 until time t1, due to the effect of the LPF 702. Therefore, if the same number of pixel data pd is sequentially gamma-corrected during time t0 to t1, since the reference voltage Vr used in the gamma correction slowly changes with time, the corresponding driving voltages may also slowly increase with time. In addition, the difference between two adjacent driving voltages is relatively small. When the driving voltages are sequentially input to the pixels at the left side of monitor block 604 and near monitor block 602, the brightness differences between the pixels may become indiscernible. Thus, the edge between the left and right monitor blocks may be blurred.

In this, a color LCD monitor with the resolution of 1024×768 is divided into 192 (=16×12) monitor blocks for executing gamma correction, respectively. In each monitor block, the reference pixel data sets for gamma-correcting red, blue, and green pixel data pd are not equal. Therefore, 16×12×3 reference pixel data sets are required. When the gamma correction apparatus of this embodiment perform gamma correction, each reference pixel data set has 16 reference pixel data pdr to generate 8 positive-polarity reference voltages Vr(+) and 8 negative-polarity reference voltages Vr(−). Each reference pixel data pdr has 6 bits of binary data. Thus, if the gamma correction apparatus 400 shown in FIG. 4 is employed to perform gamma correction, the memory device requires at least 55.3 k bits of memory space to sufficiently store all the reference pixel data pdr for the gamma correction method of this embodiment, wherein the 55.3 k bits is derived from 16×12 (number of monitor blocks)×3 (pixel colors)×16 (number of reference pixel data in each reference pixel data set)×6 (bits).

In order to reduce the memory capacity necessary for the memory device, the reference pixel data pdr is stored in the memory device by way of delta coding in this embodiment. Please refer to FIG. 9, which is a schematic illustration showing an example of the delta coding principle. In FIG. 9, each of the monitor blocks N, N+1 and N+2 has R, G, B reference pixel data sets for gamma-correcting the red, green, and blue pixel data pd. For the sake of illustration, only eight positive polarity reference pixel data pdr are listed in each reference pixel data set of FIG. 9. The spirit of the delta-coding storage method resides in that during the storage of the reference pixel data pdr, each reference pixel data pdr relates to the formerly stored reference pixel data pdr' corresponding to the reference pixel data pdr. The actual storage amount of the memory device is the difference between the reference pixel data pdr and the corresponding reference pixel data pdr', which is called the delta reference pixel data dpdr. Consequently, each reference pixel data pdr may be stored in the memory device with the data format occupying less than 6 bits of delta reference pixel data dpdr thus, reducing the amount of memory space used in the memory device. Taking FIG. 9 as an example. If the 8th reference pixel data (0) in the R reference pixel data set of the Nth monitor block is selected as the basis for the memory device, the stored value of the delta reference pixel data dpdr is equal to the difference value (10) between the pixel data dpdr and the 8th reference pixel data (0), when the adjacent 7th reference pixel data (10) is to be stored in the memory device. Similarly, the memory device stores the 6th reference pixel data (19) with the delta reference pixel data dpdr, which is the difference (9) between the 6th reference pixel data and the 7th reference pixel data (10). Analogically, each reference pixel data pdr in the R reference pixel data set of the Nth monitor block may be stored in the memory device using the same method. Hence, the memory device may store each reference pixel data pdr of the R reference pixel data set in the form of only 4 bits of delta reference pixel data dpdr. Then, when the G reference pixel data set of the Nth monitor block is to be stored, the stored value of the memory device is the difference value between each reference pixel data pdr of the G reference pixel data set and the corresponding reference pixel data pdr corresponding to the R reference pixel data set. For example, the memory device stores the second reference pixel data (49) of the G reference pixel data set with a difference value (−1) between the second reference pixel data (49) and the corresponding second reference pixel data (50) of the R reference pixel data set. When the reference pixel data pdr of the B reference pixel data set of the Nth monitor block is to be stored, the stored value of the memory device is equal to the difference between the reference pixel data pdr of the B reference pixel data set and the corresponding reference pixel data pdr of the G reference pixel data set. Thus, the G and B reference pixel data sets in the Nth monitor block may be stored in the memory device with 3 bits of delta reference pixel data dpdr. Then, when each reference pixel data pdr of the (N+1)th monitor block is to be stored, the stored value of the memory device is the difference value between the reference pixel data pdr of the (N+1)th monitor block and the corresponding reference pixel data pdr of the Nth monitor block. For example, when the first reference pixel data (62) of the R reference pixel data set in the (N+1)th monitor block is to be stored, the stored value of the memory device is the difference (−1) between the first reference pixel data (62) and the corresponding first reference pixel data (63) of the R reference pixel data set in the Nth monitor block. Using the memory device only needs 2 bits of delta reference pixel data dpdr to store all the reference pixel data pdr of the other monitor blocks. By using the delta-coding storage method, it is not necessary for each reference pixel data pdr to be stored in 6 bit data format, thus saving memory space.

Figure 10:
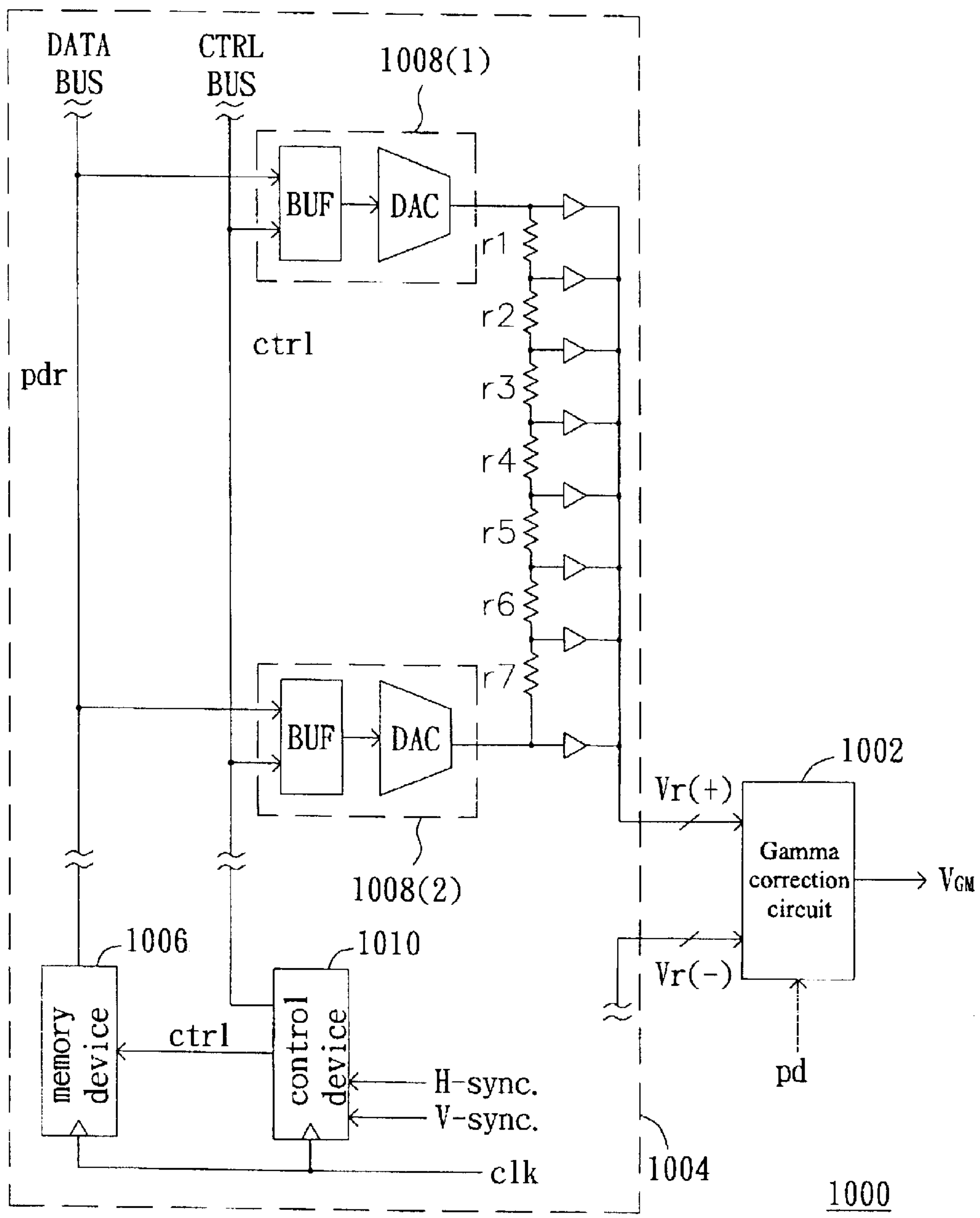
FIG. 10 is a schematic illustration showing another gamma correction apparatus according to another embodiment of the invention.

Referring again to FIG. 9, the values of corresponding reference pixel data pdr are nearly equal in each reference pixel data set, and the difference values between each reference pixel data pdr and its adjacent reference pixel data pdr in each reference pixel data set are also nearly equal. Please refer to FIG. 10, which is a schematic illustration showing another gamma correction apparatus according to another embodiment of the invention. In FIG. 10, the reference voltage generating circuit 1004 includes a resistor string, two ends of which are coupled to the reference voltage output circuits 1008(1) and 1008(2), respectively. The reference voltage output circuits 1008(1) and 1008(2) output maximum and minimum positive-polarity reference voltages Vr(+) according to the reference pixel data pdr. Other reference voltages Vr(+) may be obtained using resistors to divide the voltage into other reference voltages Vr(+) to be output to the gamma correction circuit 1002 at each node coupled between two resistors in the resistor string. Similarly, the negative-polarity reference voltages Vr(−) may also be generated using this method; a detailed description thereof is omitted. Thus, each reference pixel data set stored in the memory device 1006 only needs to store two reference voltages pdr, and accordingly the capacity of the memory device may be saved. Meanwhile, the gamma correction effects will not be significantly influenced. It should be noted that the invention is not limited to two reference voltage generating circuits 1008(1) and 1008(2). Instead, a proper number of reference voltage generating circuits 1008 may be provided to output the reference voltages Vr according to the reference pixel data pdr by considering the precision requirements of the reference voltages Vr and the degree of memory space saved in the memory device. Other reference voltages Vr may be output from the nodes between the resistors of the resistor string. In addition, the memory device 1006 may be used in conjunction with the above-mentioned delta-coding storage method to store the required reference pixel data pdr so that the need to save memory space in the memory device is satisfied.

In the gamma correction apparatus and the method used for executing gamma correction according to the embodiments of the invention, the corresponding reference voltage for the reference voltage generating circuit to gamma-correct the pixel data is output according to the position of the pixel corresponding to the pixel data in the LCD monitor and the displayed color of the pixel. Therefore, it is possible to prevent the gamma correction effects from being influenced by the display colors of the pixels and the gaps between the upper plate and lower plate of the pixels. Accordingly, the color-shading problem of the LCD monitor may be resolved, and the display quality of the LCD monitor may be enhanced.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An apparatus for gamma correction in a liquid crystal display (LCD) for receiving a pixel data and outputting a driving voltage corresponding to the pixel data to the LCD, wherein the LCD including a plurality of pixels arranged in a matrix and the driving voltage is used to determine a brightness of the pixel in the LCD, the apparatus comprising:

a reference voltage generating circuit for generating a plurality of reference voltages according to a position of the pixel in the LCD; and a gamma correction circuit for gamma-correcting the pixel data according to the reference voltages and generating the driving voltage to the LCD.

2. The apparatus according to claim 1, wherein the reference voltage generating circuit comprises:

a memory device for storing a plurality of reference data, and the memory device outputting the corresponding reference data according to the position of the pixel in the LCD; and a plurality of reference voltage output circuits, each of which for receiving one of the reference data and generating one of the reference voltages according to the reference data.

3. The apparatus according to claim 2, wherein the reference data is in the form of a digital format.

4. The apparatus according to claim 3, wherein each of the reference voltage output circuits comprises a digital-to-analog converter (DAC) for generating the reference voltage according to the reference data.

5. The apparatus according to claim 2, wherein the reference voltage generating circuit further comprises a control device for controlling the memory device to output the corresponding reference data according to the position of the pixel in the LCD and for controlling each of the reference voltage output circuits to receive the corresponding reference data.

6. The apparatus according to claim 5, wherein the control device comprises:

a horizontal counter for generating a horizontal counting signal according to a clock signal;

a vertical counter for generating a vertical counting signal according to the clock signal and a horizontal sync signal; and a controller for generating a first control signal to the memory device according to the clock signal, the horizontal counting signal and the vertical counting signal, for controlling the memory device to output the corresponding reference data, and for generating a second control signal to the reference voltage output circuits to control each of the reference voltage output circuits to receive the corresponding reference data.

7. The apparatus according to claim 2, wherein the reference voltage generating circuit further comprises a resistor string coupled between two of the reference voltage output circuits, and at least one node for generating one of the reference voltages.

8. The apparatus according to claim 2, wherein the memory device stores the reference data according to difference values between each reference data and other reference data corresponding to the reference data in the memory device.

9. The apparatus according to claim 1, wherein the reference voltage generating circuit generates the reference voltages further according to a display color of the pixel in the LCD.

10. A display system comprising the apparatus for gamma correction as claimed in claim 1 and the LCD.

11. An apparatus for gamma correction in a liquid crystal display (LCD) for receiving a pixel data and outputting a driving voltage corresponding to the pixel to the LCD, wherein the LCD including a plurality of pixels arranged in a matrix and the driving voltage is used to determine a brightness of the pixel in the LCD, wherein the matrix is divided into a plurality of blocks, the apparatus comprising:

a reference voltage generating circuit for generating a plurality of reference voltages according to a block to which the pixel belongs in the LCD; and a gamma correction circuit for gamma-correcting the pixel data according to the reference voltages and generating the driving voltage to the LCD.

12. The apparatus according to claim 11, wherein the reference voltage generating circuit comprises:

a memory device for storing a plurality of reference data, and the memory device outputting the corresponding reference data according to the block to which the pixel belongs in the LCD; and a plurality of reference voltage output circuits, each of which for receiving one of the reference data and generating one of the reference voltages according to the reference data.

13. The apparatus according to claim 12, wherein the reference data is in the form of a digital format.

14. The apparatus according to claim 13, wherein each of the reference voltage output circuits comprises a digital-to-analog converter (DAC) for generating the reference voltage according to the reference data.

15. The apparatus according to claim 14, wherein each of the reference voltage generating circuits further comprises a low-pass filter (LPF) for easing variation degrees of the reference voltage generated from the DAC.

16. The apparatus according to claim 12, wherein the reference voltage generating circuit further comprises a resistor string coupled between two of the reference voltage output circuits, and at least one node for generating one of the reference voltages.

17. The apparatus according to claim 12, wherein the memory device stores the reference data according to difference values between each reference data and other reference data corresponding to the reference data in the memory device.

18. The apparatus according to claim 12, wherein the reference voltage generating circuit further comprises a control device for controlling the memory device to output the corresponding reference data according to the block to which the pixel belongs in the LCD and for controlling each of the reference voltage output circuits to receive the corresponding reference data.

19. The apparatus according to claim 18, wherein the control device comprises:

a horizontal counter for generating a horizontal counting signal according to a clock signal;

a vertical counter for generating a vertical counting signal according to the clock signal and a horizontal sync signal; and a controller for generating a first control signal to the memory device according to the clock signal, the horizontal counting signal and the vertical counting signal, for controlling the memory device to output the corresponding reference data, and for generating a second control signal to the reference voltage output circuits to control each of the reference voltage output circuits to receive the corresponding reference data.

20. The apparatus according to claim 11, wherein each of the blocks has an irregular shape, and edges of each of the blocks are saw-toothed lines.

21. The apparatus according to claim 11, wherein the reference voltage generating circuit generates the reference voltages further according to a display color of the pixel in the LCD.

22. An apparatus for gamma correction in a liquid crystal display (LCD) for receiving a pixel data and outputting a driving voltage corresponding to the pixel data to the LCD, wherein the LCD including a plurality of pixels arranged in a matrix and the driving voltage is used to determine a brightness of the pixel in the LCD, the apparatus comprising:

a memory device;

a reference voltage output circuit for generating a reference voltage according to a digital data from the memory; and a gamma correction circuit for generating the driving voltage according to the pixel data and the reference voltage.

23. The apparatus according to claim 22, wherein the reference voltage output circuit comprises a digital-to-analog converter (DAC) for generating the reference voltage.

24. The apparatus according to claim 22, further comprising a second reference voltage output circuit for generating a second reference voltage according to a second digital data from the memory; and a resistor string coupled between the reference voltage output circuit and the second reference output circuit and having at least one node for generating a third reference voltage;

wherein the gamma correction circuit generates the driving voltage further according to the second and third reference voltages.

* * * * *